(12) United States Patent
Gao et al.

(10) Patent No.: US 12,167,551 B2
(45) Date of Patent: Dec. 10, 2024

(54) HOUSING AND TERMINAL DEVICE INCLUDING THE HOUSING

(71) Applicant: HONOR DEVICE CO., LTD., Shenzhen (CN)

(72) Inventors: Jiuliang Gao, Shenzhen (CN); Kangle Xue, Shenzhen (CN); Yan Wang, Shenzhen (CN); Chuanguo Wang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/790,726

(22) PCT Filed: Jan. 18, 2022

(86) PCT No.: PCT/CN2022/072604
§ 371 (c)(1),
(2) Date: Jul. 2, 2022

(87) PCT Pub. No.: WO2022/242212
PCT Pub. Date: Nov. 24, 2022

(65) Prior Publication Data
US 2024/0179858 A1 May 30, 2024

(30) Foreign Application Priority Data
May 20, 2021 (CN) .......................... 202121085023.9

(51) Int. Cl.
*H05K 5/02* (2006.01)
*H04M 1/02* (2006.01)
*H04M 1/03* (2006.01)

(52) U.S. Cl.
CPC ........ *H05K 5/0215* (2022.08); *H04M 1/0283* (2013.01); *H04M 1/035* (2013.01)

(58) Field of Classification Search
None
See application file for complete search history.

(56) References Cited

U.S. PATENT DOCUMENTS

| 6,621,910 B1 | 9/2003 | Weckstroem et al. |
| 10,091,340 B2 | 10/2018 | Zeng et al. |

(Continued)

FOREIGN PATENT DOCUMENTS

| CN | 101699829 A | 4/2010 |
| CN | 204119279 U | 1/2015 |

(Continued)

*Primary Examiner* — Hoa C Nguyen
*Assistant Examiner* — John B Freal
(74) *Attorney, Agent, or Firm* — WOMBLE BOND DICKINSON (US) LLP

(57) ABSTRACT

A housing comprises a first housing with a first through-hole, a second housing with a second through-hole, a decoration part with a third through-hole, and a first breathable film. The first housing is disposed outside the second housing, and the decoration part is disposed on the first housing and covers the first through-hole. An orthographic projection of the third through-hole on the second housing is located outside an orthographic projection of the second through-hole on the second housing. A first gap exists between the decoration part and the second housing and is communicated with both the second through-hole and the third through-hole. The first breathable film is disposed on the second housing and covers the second through-hole.

20 Claims, 2 Drawing Sheets

(56) References Cited

U.S. PATENT DOCUMENTS

| | | | |
|---|---|---|---|
| 11,165,894 B2 * | 11/2021 | Li | .............................. H04B 1/08 |
| 11,375,054 B2 | 6/2022 | Li et al. | |
| 2014/0146452 A1 * | 5/2014 | Chu | ..................... H05K 5/0008 |
| | | | 361/679.01 |
| 2015/0114090 A1 | 4/2015 | Fukuda | |
| 2018/0198901 A1 * | 7/2018 | Kubo | ....................... G01K 1/16 |

FOREIGN PATENT DOCUMENTS

| | | |
|---|---|---|
| CN | 108632419 A | 10/2018 |
| CN | 112533430 A | 3/2021 |
| CN | 213754589 U | 7/2021 |
| EP | 1313359 A2 | 5/2003 |
| EP | 3780919 A1 | 2/2021 |
| JP | 2009010234 A | 1/2009 |
| WO | 2017163560 A1 | 9/2017 |

* cited by examiner

HOUSING AND TERMINAL DEVICE INCLUDING THE HOUSING

CROSS-REFERENCE TO RELATED APPLICATIONS

This application is a National Stage of International Application No. PCT/CN2022/072604, filed on Jan. 18, 2022, which claims priority to Chinese Patent Application No. 202121085023.9, filed on May 20, 2021. The disclosures of which are incorporated herein by reference in their entireties.

TECHNICAL FIELD

Embodiments of this application relate to the field of terminal technologies, and in particular, to a housing and a terminal device including the housing.

BACKGROUND

When there is a pressure difference between an internal space and an external space of a terminal device, sound transmission of an acoustic component is affected, and a noise occurs. In the prior art, a terminal device adjusts a pressure balance by using a hole structure on an internal structure of the terminal device. For example, a hole structure is disposed on a middle frame of a mobile phone, so that air can flow inside and outside the mobile phone. This increases a layout difficulty of the middle frame and affects integrity of the middle frame.

SUMMARY

In view of this, this application provides a housing with pressure balancing performance.

According to a first aspect, this application provides a housing, including a first housing, a second housing, a decoration part, and a first breathable film, where the first housing is attached outside the second housing, the first housing is provided with a first through-hole, the decoration part is disposed on the first housing and covers the first through-hole, and the second housing is provided with a connected second through-hole; the decoration part is provided with a third through-hole; an orthographic projection of the third through-hole on the second housing is located outside an orthographic projection of the second through-hole on the second housing; and a first gap exists between the decoration part and the second housing, and the first gap is communicated with both the second through-hole and the third through-hole; and the first breathable film is disposed on the second housing and covers the second through-hole.

In the foregoing design, the second through-hole provided by the second housing, the third through-hole provided by the decoration part, and the first gap between the decoration part and the second housing form an airflow channel on the housing, and the first breathable film is disposed on the second through-hole, so that the housing has pressure balancing performance.

The housing provides an airflow channel. When the housing is installed on a device, no internal space of the device is occupied, and a pressure balancing structure does not need to be disposed inside the device.

In a possible design, a first groove is disposed on a side of the second housing that faces the first housing, and the first groove intersects the second through-hole; and the decoration part is connected to the first housing on a peripheral side of the first through-hole in a sealed manner, and the first gap exists between a part of the decoration part and a groove wall of the first groove.

In the foregoing design, the first groove and the second through-hole that are disposed on the second housing and the first gap formed between the decoration part and the second housing form an airflow channel; and the channel has a simple structure, and can be easily manufactured on the housing.

In a possible design, the housing further includes a support member; two sides of the support member are respectively in contact with the groove wall of the first groove and the decoration part; and the support member is provided with a second groove, and the second groove forms the first gap.

In the foregoing design, the support member provides support for the decoration part, thereby improving structural stability of the first gap between the second housing and the decoration part.

In a possible design, the first breathable film is attached to the groove wall of the first groove; the housing further includes a pressing member, and the pressing member abuts on the first breathable film; and a third groove is disposed in the pressing member, and the third groove is communicated with both the first gap and the second through-hole.

In the foregoing design, the pressing member applies a force on the first breathable film, so that the first breathable film is stably connected to the second housing.

In a possible design, the pressing member is bonded to the first housing or the groove wall of the first groove.

In the foregoing design, a position of the pressing member is stable, and the pressing member is stably pressed against the first breathable film, so that the airflow channel is not blocked due to a position change.

In a possible design, the decoration part includes a main body and a connection portion; the connection portion is disposed on a peripheral side of the main body; and the main body is exposed from the first through-hole; and the connection portion is connected to the first housing in a sealed manner, and the main body or the connection portion is connected to the second housing.

In the foregoing design, the connection portion is disposed on the first housing, so that the first housing is connected to the decoration part on the peripheral side of the first through-hole in a sealed manner. The connection portion is partially disposed on the second housing, and the first gap between the decoration part and the groove wall of the first groove is formed at a disconnection point between the connection portion and the second housing.

In a possible design, a second gap exists between a side wall of the connection portion and the pressing member; and the second gap is communicated with the first gap.

In the foregoing design, the second gap is communicated with the first gap, so that air can flow between the third through-hole and the second through-hole.

In a possible design, the first breathable film is a film structure with waterproof performance, the first housing is a structure made of a soft material with waterproof performance, and a hardness of the decoration part is greater than that of the first housing.

In the foregoing design, the first housing is located outside the device, and the first housing is made of a soft material. When a waterproof test is performed on the device, a fixture may be used to seal the third through-hole on the decoration part, so that the third through-hole is not disposed on the first housing that may easily deform, so as to avoid a problem that when the fixture acts on the first housing, the first housing deforms and results in a sealing failure.

In a possible design, the housing further includes a second breathable film, and the second breathable film is disposed on the decoration part and covers the third through-hole.

In the foregoing design, the second breathable film further improves reliability of the housing.

In a possible design, an annular structure is disposed on a side of the decoration part that is away from the second housing, and the first through-hole is exposed from the annular structure; and the third through-hole is located in the annular structure.

In the foregoing design, the third through-hole is disposed in the annular structure, an appearance of the housing is beautified; the third through-hole is disposed in the annular structure, and a space for disposing the third through-hole does not need to be provided on the decoration part outside the annular structure, thereby improving structural compactness of the decoration part.

According to a second aspect, this application provides a terminal device, where the housing is configured to isolate an internal space of the terminal device from an external space of the terminal device, the third through-hole is communicated with the external space of the terminal device, and the first housing forms an outer surface of the terminal device.

For a technical effect brought by the second aspect, refer to the descriptions about the housing structure in the first aspect. Details are not described herein again.

DESCRIPTION OF REFERENCE SIGNS OF MAIN COMPONENTS

Housing: 100, 100a, and 100b; first housing: 10; first through-hole: 101; second housing: 20, 20a, and 20b; second through-hole: 201; first groove: 205; groove wall: 2051; support portion: 2053; sixth groove: 207; decoration part: 30; third through-hole: 301; main body: 31; connection portion: 33; first breathable film: 40; support member: 50; second groove: 501; pressing member: 60 and 60a; third groove: 601; fourth through-hole: 6011; fourth groove: 6013; fifth groove: 603; second breathable film: 70.

DESCRIPTION OF EMBODIMENTS

To further describe technical means and effects that are used by this application to achieve a predetermined application objective, the following describes embodiments with reference to accompanying drawings and implementations. Apparently, the described embodiments are only some rather than all of the embodiments of this application.

Unless otherwise defined, all technical and scientific terms as used herein have the same meanings as those usually understood by a person skilled in the art of this application. The terms used in the specification of this application herein are only used to describe particular embodiments, but not intended to limit this application.

Some implementations of this application provide a housing, including a first housing, a second housing, a decoration part, and a first breathable film. The first housing is attached outside the second housing. The first housing is provided with a first through-hole. The decoration part is disposed on the first housing and covers the first through-hole. The second housing is provided with a communicated second through-hole. The decoration part is provided with a third through-hole. An orthographic projection of the third through-hole on the second housing is located outside an orthographic projection of the second through-hole on the second housing. A first gap exists between the decoration part and the second housing, and the first gap is communicated with both the second through-hole and the third through-hole. The first breathable film is disposed on the second housing and covers the second through-hole.

In the foregoing housing, the first housing is disposed outside the second housing, and the decoration part is disposed on the first housing; and the second through-hole provided by the second housing, the third through-hole provided by the decoration part, and the first gap between the decoration part and the second housing form an airflow channel on the housing, and the first breathable film is disposed on the second through-hole, so that the housing has pressure balancing performance.

The following describes in detail some embodiments of this application with reference to the accompanying drawings. The following embodiments and features in the embodiments may be combined, provided that no conflict occurs.

First Embodiment

Figure 1:
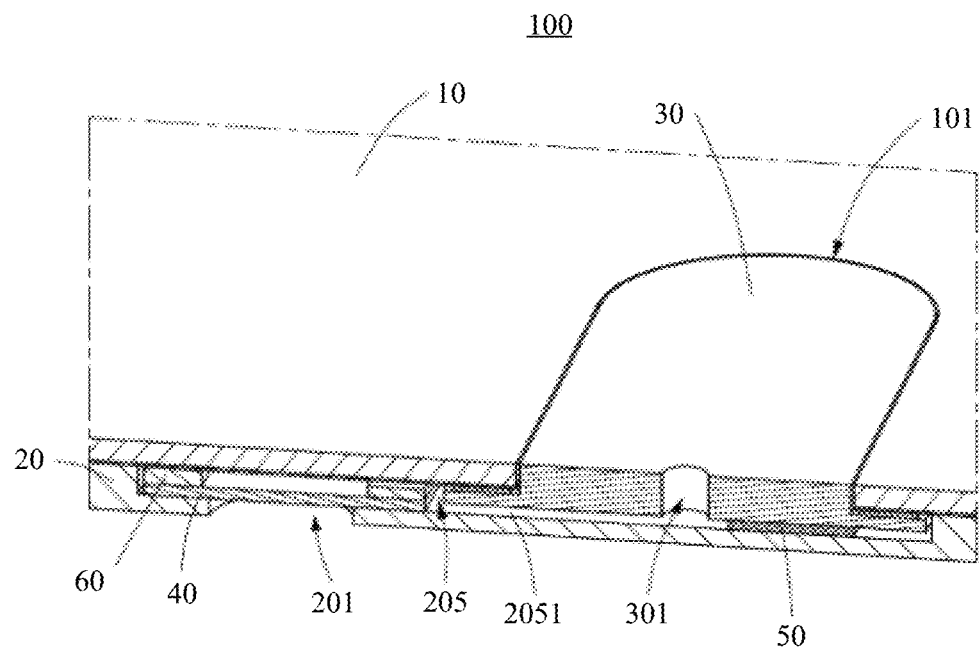
FIG. 1 is a schematic diagram of a cross-sectional structure of a housing according to a first embodiment of this application.
Figure 2:
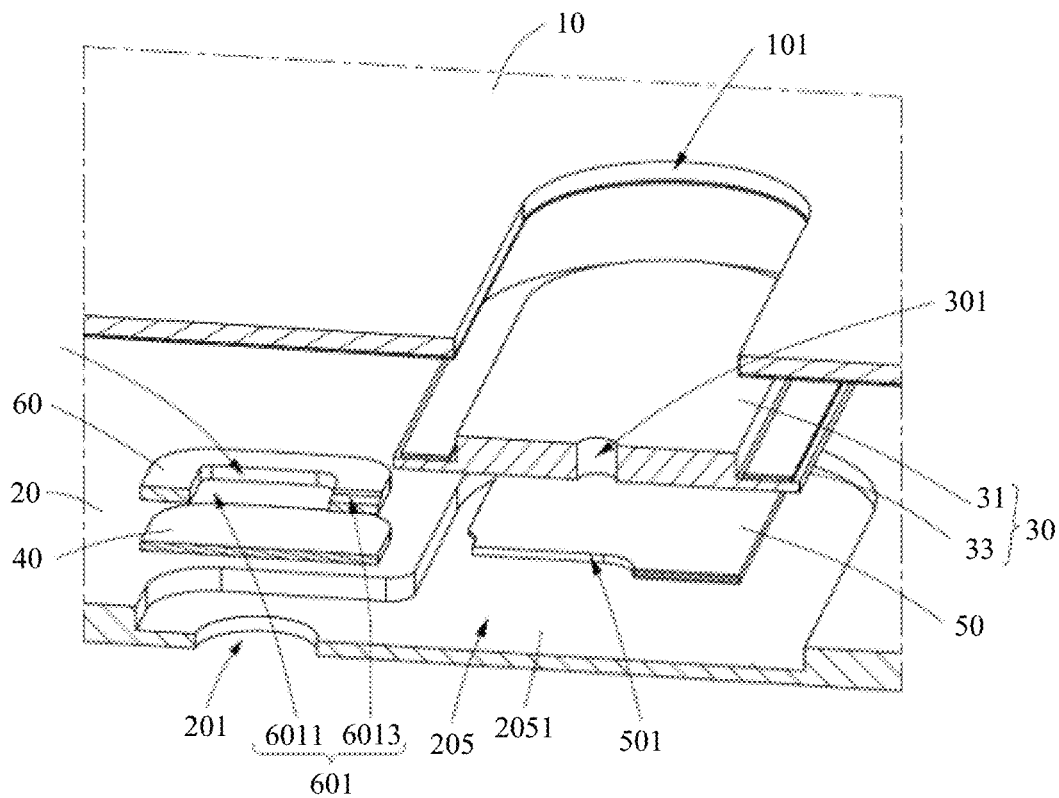
FIG. 2 is a schematic diagram of a structure of the housing shown in FIG. 1.

Referring to both FIG. 1 and FIG. 2, the first embodiment of this application provides a housing 100. The housing 100 is configured to be installed on a device (not shown in the figure), and the housing 100 can balance an internal space of the device and an external space of the device. The housing 100 includes a first housing 10, a second housing 20, a decoration part 30, and a first breathable film 40. The first housing 10 is disposed outside the second housing 20. The first housing 10 is provided with a first through-hole 101. The decoration part 30 is disposed on the first housing 10 and covers the first through-hole 101. The second housing 20 is provided with a communicated second through-hole 201. The decoration part 30 is provided with a third through-hole 301. An orthographic projection of the third through-hole 301 on the second housing 20 is located outside an orthographic projection of the second through-hole 201 on the second housing 20. A first gap exists between a side of the decoration part 30 that faces the second housing 20 and the second housing 20. The first breathable film 40 is disposed between the first housing 10 and the second housing 20 and covers the second through-hole 201.

When the housing 100 is installed on a device, the second housing 20 faces the inside of the device, and the decoration part 30 and the first housing 10 face the outside of the device. The first housing 10 forms an outer surface of the device. When an internal pressure of the device increases, air passes through the second through-hole 201, the first breathable film 40, the first gap between the decoration part 30 and the second housing 20, and is discharged from the third through-hole 301 to the outside of the device, so as to balance the internal pressure and an external pressure of the device. In addition, when the internal pressure of the device decreases, the air may also enter from the third through-hole 301, and enter the device through the first gap between the decoration part 30 and the second housing 20, the first breathable film 40, and the second through-hole 201. The air may be exchanged with an external device by using the housing 100, so as to ensure pressure balance of the device and improve function stability of the device.

In this embodiment, the first breathable film 40 is a film structure with waterproof performance. An orthographic projection of the third through-hole 301 on the second housing 20 is located outside the second through-hole 201, and the third through-hole 301 and the second through-hole 201 are disposed in staggered manner, so that a sharp object outside the device does not pierce the first breathable film 40 through the third through-hole 301, thereby improving waterproof performance of the housing 100.

In this embodiment, the housing 100 is applied to a terminal device (not shown in the figure). Specifically, the housing 100 is applied to a mobile phone, but is not limited thereto. The terminal device includes but is not limited to a mobile phone, a tablet computer, a smartwatch, and a notebook computer.

In the first embodiment of this application, a hole structure (the first through-hole 101, the second through-hole 201, and the third through-hole 301) is disposed on the housing 100, and the first gap between the decoration part 30 and the second housing 20 is formed on the housing 100, so as to provide a channel through which the air flows inside and outside the device, thereby implementing pressure balance. In this manner, no internal space of the device is not occupied, space utilization of the device and integrity of a structural component inside the device are improved, and strength of the structural component is further improved.

To change a touch feeling or appearance of the device, in this embodiment, the first housing 10 is made of a soft material with waterproof performance, the second housing 20 is made of a plastic material, and the decoration part 30 is made of a metal material. The soft material includes but is not limited to a material that has a waterproof property and is formed by processing, such as cloth, leather, or fur. In this embodiment, the first housing 10 is made of PU (Polyurethane, polyurethane) artificial leather. It can be understood that, in another embodiment, the first housing 10 may alternatively be a hard housing structure, and the second housing 20 and the decoration part 30 may alternatively be made of another material.

In this embodiment, the decoration part 30 is configured to decorate the housing 100. For example, the decoration part 30 may be a nameplate, a label, or the like. An annular structure (not shown in the figure) is disposed on a side of the decoration part 30 that is away from the second housing 20. The annular structure can be exposed from the first through-hole 101. The third through-hole 301 is located in the annular structure. The annular structure can be in a shape of a letter, a character, or a graph. For example, the letter can be "P", "O", "D", "R", or the like; the character can be "回", "口", "部", or the like; and the graph can be "Δ", "□" or in a shape of a flower.

The third through-hole 301 is disposed in the annular structure, and a space for disposing the third through-hole 301 does not need to be provided on the decoration part 30 outside the annular structure, thereby improving structural compactness of the decoration part 30. A quantity of third through-holes 301 is not limited. For example, in an embodiment, the quantity of third through-holes 301 may be the same as a quantity of annular structures. A shape of the third through-hole 301 is similar to an annular structure. For example, the annular structures includes "Δ" and "D", and there are two third through-holes 301: The shape of one third through-hole 301 is similar to "Δ", and the shape of the other third through-hole 301 is similar to "D". In another embodiment, a plurality of third through-holes 301 may be disposed in each annular structure. A plurality of third through-holes 301 are disposed in an annular structure to reduce a hole diameter of the third through-hole 301, so as to prevent a sharp object outside the device from piercing the third through-hole 301.

There may also be one or more second through-holes 201, and each second through-hole 201 is covered by the first breathable film 40.

Generally, a terminal device matches a suitable protection cover. For example, a mobile phone and a tablet computer match protection covers. To ensure clear imaging, a camera assembly is exposed from the protection cover. In the prior art, the terminal device balances an internal pressure and an external pressure of the terminal device by providing a hole structure communicated with the camera assembly. However, a user may attach a protective film to the camera assembly to protect the camera, and the protective film closes the hole structure of the camera assembly, which disables a pressure balancing function of the terminal device.

Generally, a corresponding part is exposed from the protection cover based on performance of the terminal device, for example, a camera, a receiver, or a microphone is exposed. Correspondingly, when the housing 100 in the first embodiment of this application is applied to the terminal device, the protection cover of the terminal device is correspondingly exposed from the third through-hole 301, so that the pressure balancing performance of the terminal device is not disabled.

It can be understood that, in another embodiment, the housing 100 may alternatively be applied to another device that includes an acoustic component and needs to be waterproof, such as a learning machine or a robot.

Referring to FIG. 2, the second housing 20 is connected to the first housing 10 by using an adhesive, and is sealed at a connection point, but is not limited thereto. It can be understood that, in another embodiment, the first housing 10 may alternatively be disposed outside the second housing 20 in another manner, for example, by using a fastener, and may be connected in a sealed manner on an outer circumference of an airflow channel (a channel formed by a second through-hole 201, a third through-hole 301, and the first gap between the decoration part 30 and the second housing 20) on the housing 100. The decoration part 30 is bonded to the peripheral side of the first through-hole 101 of the first housing 10 in a sealed manner, to avoid a gap between the decoration part 30 and the first housing 10, so as to prevent liquid outside the device from entering the device. Specifically, the decoration part 30 is connected to the first housing 10 by using an adhesive, and is sealed at a connection point.

An existing terminal device is provided with a hole structure on a groove between parts. For example, the hole structure is provided on a groove between a camera decoration part and a battery cover (the battery cover is a housing structure of the terminal device), so that internal air is exchanged with air in the external space through the hole structure and the groove, to implement pressure balance. When a waterproof performance test is performed on the terminal device, the hole structure needs to be sealed by using a fixture. However, when the battery cover of the terminal device is made of a soft material, the battery cover is easily deformed by force, and the sealing of the hole structure may fail.

In the first embodiment of this application, a hardness of the decoration part 30 is greater than that of the first housing 10. When a test such as a waterproof test is performed on the device, a fixture (not shown in the figure) is used on the decoration part 30 to seal the third through-hole 301, so as to ensure that the that the entire device is in a sealed state. The hole structure (the third through-hole 301) from which the air enters the device is not disposed on the first housing 10 that may easily deform, so as to avoid a problem that when the fixture acts on the first housing 10, the first housing 10 deforms and results in a sealing failure.

A first groove 205 is disposed on a side of the second housing 20 that faces the first housing 10. The first groove 205 intersects the second through-hole 201. A first gap exists between the decoration part 30 and a groove wall 2051 of the first groove 205. The second through-hole 201 and the first groove 205 that are disposed on the second housing 20, the first gap between the decoration part 30 and the second housing 20, and the third through-hole 301 form an airflow channel; and the channel has a simple structure, and can be easily manufactured on the housing 100.

Specifically, the decoration part 30 includes a main body 31 and a connection portion 33. The connection portion 33 is disposed on a peripheral side of the main body 31. The main body 31 is exposed from the first through-hole 101. The third through-hole 301 is disposed on the main body 31. The connection portion 33 is disposed on the first housing 10, so that the first housing 10 is connected to the decoration part 30 in a sealed manner on a peripheral side of the first through-hole 101. The main body 31 is disposed on the second housing 20. The first gap between the decoration part 30 and the groove wall 2051 of the first groove 205 is formed at a disconnection point between the main body 31 and the second housing 20.

It can be understood that, in another embodiment, the connection portion 33 may alternatively be connected to the second housing 20, so that the decoration part 30 is connected to the second housing 20. That is, a side of the decoration part 30 that faces the second housing 20 is connected (for example, is bonded by using an adhesive) to the second housing 20. The first gap between a side of the decoration part 30 that faces the second housing 20 and a side wall 2051 is formed at a disconnection point between the decoration part 30 and the second housing 20, and the first gap is communicated with the third through-hole 301, so that air passing through the third through-hole 301 may flow to the second through-hole 201.

In this embodiment, a thickness of the connection portion 33 is less than that of the main body 31. The connection portion 33 is located between the second housing 20 and the first housing 10. The main body 31 and a side of the connection portion 33 that is away from the second housing 20 are coplanar, but are not limited thereto.

It can be understood that, in another embodiment, the decoration part 30 may alternatively be another structure such as a flat plate structure. In another embodiment, the decoration part 30 may alternatively be bonded to a side of the first housing 10 that is away from the second housing 20.

Referring to FIG. 2, the housing 100 further includes a support member 50. Two sides of the support member 50 are respectively in contact with the groove wall 2051 and the decoration part 30 of the first groove 205. The support member 50 is provided with a second groove 501. The second groove 501 is communicated with the first groove 205, the second through-hole 201, and the third through-hole 301. The structure of the second groove 501 causes the first gap to be formed between the decoration part 30 and the groove wall 2051 of the first groove 205. The support member 50 provides support for the decoration part 30, thereby improving structural stability of the first gap between the second housing 20 and the decoration part 30.

It can be understood that, in another embodiment, when the first housing 10 is made of a hard material, the support member 50 may be omitted. The decoration part 30 is bonded to the first housing 10, and a thickness of the decoration part 30 may be set to be less than a depth of the first groove 205, that is, a stable first gap may be formed between the decoration part 30 and the groove wall 2051 of the first groove 205.

In this embodiment, the support member 50 is an adhesive, and the support member 50 is bonded to both the groove wall 2051 and the decoration part 30 of the first groove 205, but is not limited thereto. It can be understood that, in another embodiment, the support member 50 may alternatively be a structure made of plastic, metal, or the like, so as to support the decoration part 30, and prevent the decoration part 30 from moving due to deformation of the first housing 10, thereby ensuring that the airflow channel is not blocked.

It can be understood that, in another embodiment, the support member 50 may alternatively be omitted, and the decoration part 30 directly abuts on the second housing 20. By providing another groove in a side of the decoration part 30 that faces the second housing 20, the first gap between the decoration part 30 and the groove wall 2051 of the first groove 205 is formed. In still another embodiment, the first gap between the decoration part 30 and the groove wall 2051 of the first groove 205 may alternatively be formed by providing another groove on the groove wall 2051 of the first groove 205.

In the first embodiment, the first breathable film 40 is attached to the groove wall 2051 of the first groove 205. The housing 100 further includes a pressing member 60. A side of the pressing member 60 that faces the first breathable film 40 abuts on the first breathable film 40. A side of the first housing 10 that faces the second housing 20 abuts on the pressing member 60. The pressing member 60 is provided with a third groove 601. The third groove 601 includes a communicated fourth through-hole 6011 and a communicated fourth groove 6013. The fourth through-hole 6011 is corresponding to the second through-hole 201 and is communicated by using the first breathable film 40. The fourth groove 6013 penetrates a side of the pressing member 60 that is close to the decoration part 30, and the pressing member 60 applies a force on the first breathable film 40, so that the first breathable film 40 is stably connected to the groove wall 2051 of the first groove 205, thereby further improving waterproof performance of the housing 100.

It can be understood that, in another embodiment, the pressing member 60 may alternatively be approximately a U-shaped structure including a notch, the pressing member 60 is pressed against the first breathable film 40, and the notch of the pressing member 60 is communicated with both the second through-hole 201 and the first gap between the decoration part 30 and the second housing 20.

To stabilize the position of the pressing member 60, the pressing member 60 is bonded to the first housing 10, but is not limited thereto. For example, in another embodiment, an area of an orthographic projection of the pressing member 60 on the second housing 20 is greater than an area of the second through-hole 201, and the area of the orthographic projection of the pressing member 60 on the second housing 20 may be greater than the first breathable film 40, so that the pressing member 60 can be bonded to the groove wall of the first groove 205, and the pressing member 60 can be pressed against the first breathable film 40. The pressing member 60 is stably pressed against the first breathable film 40, so that the airflow channel is not blocked due to a position change. A maximum area of the orthographic projection of the pressing member 60 on the second housing 20 may alternatively be equal to or less than the first breathable film 40, and the pressing member 60 is bonded to the first housing 10 and/or the first breathable film 40 by using an adhesive.

The pressing member 60 may be an adhesive or a structure made of a metal or plastic material.

A second gap exists between a side of the connection portion 33 of the decoration part 30 that is close to a side wall of the pressing member 60 and the pressing member 60 and the first breathable film 40, so that the air flows from the fourth groove 6013 to the first gap formed by the second groove 501 through the second gap.

It can be understood that, in another embodiment, the pressing member 60 may alternatively be omitted.

It can be understood that, to match a thickness of the decoration part 30 and a thickness of the pressing member 60, the first groove 205 may have different depths, for example, a step structure, that is, the groove wall 2051 may have planes of different heights.

Second Embodiment

Figure 3:
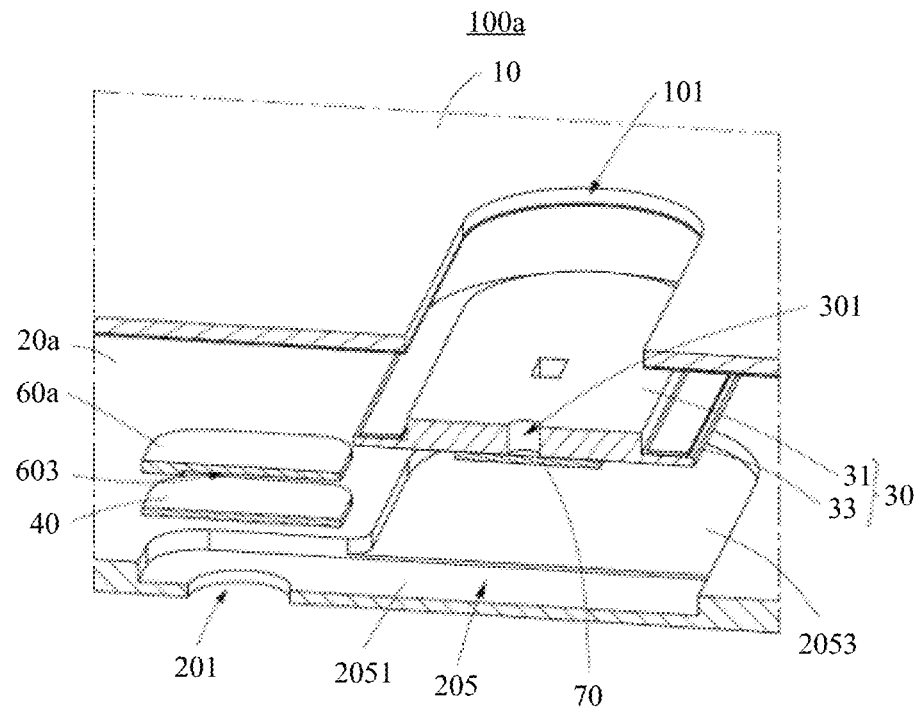
FIG. 3 is a schematic diagram of a cross-sectional structure of a housing according to a second embodiment of this application.

Referring to FIG. 3, the second embodiment of this application provides a housing 100a. The housing 100a is basically the same as the housing 100 in the first embodiment, and main differences are as follows: The housing 100a has no support member 50 in the first embodiment; a structure of the second housing 20a in the housing 100a is different from the structure of the second housing 20 in the first embodiment; a structure of the middle pressing member 60a in the housing 100a is different from the structure of the pressing member 60; and the housing 100a further includes a second breathable film 70.

The second breathable film 70 is a film structure with waterproof performance.

A part of the groove wall 2051 of the first groove 205 of the housing 100a extends outward to form a support portion 2053. The decoration part 30 abuts on or is bonded to the support portion 2053. The second breathable film 70 is disposed on the decoration part 30 and covers the third through-hole 301.

The pressing member 60a is a plate-like structure. A fifth groove 603 is disposed on a side of the pressing member 60a that faces the second housing 20a. The fifth groove 603 is away from the second through-hole 201. The fifth groove 603 penetrates a side of the pressing member 60a to communicate with the first groove 205 and the first gap between the decoration part 30 and the second housing 20.

It can be understood that, in another embodiment, the first breathable film 40 and the second breathable film 70 may extend toward each other to form a whole. A connection portion of the first breathable film 40 and the second breathable film 70 separates the first gap between the decoration part 30 and the second housing 20 into a first part and a second part. The air enters the device successively through the third through-hole 301, the second breathable film 70, the first part of the first gap, the connection portion of the first breathable film 40 and the second breathable film 70, the second part of the first gap, the first breathable film 40, and the second through-hole 201.

The second breathable film 70 covers the third through-hole 301, thereby improving dustproof performance and waterproof performance of the housing 100, and further improves reliability of the housing 100.

Third Embodiment

Figure 4:
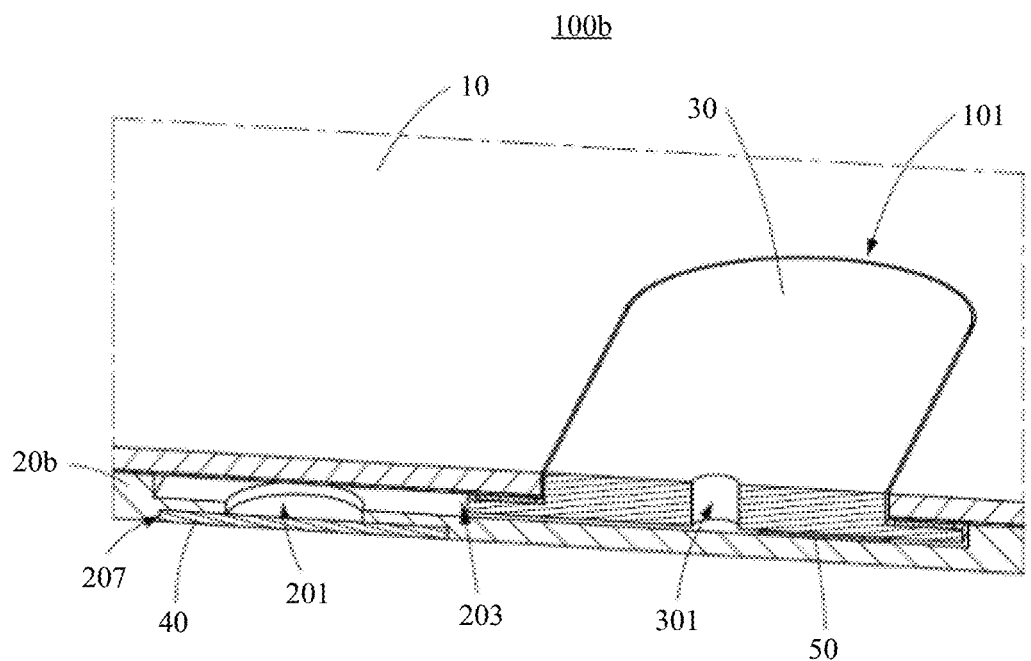
FIG. 4 is a schematic diagram of a cross-sectional structure of a housing according to a third embodiment of this application.

Referring to FIG. 4, a third embodiment of this application provides a housing 100b. The housing 100b is basically the same as the housing 100 in the first embodiment, and main differences are as follows: The housing 100b has no pressing member 60 in the first embodiment; and the first breathable film 40 is disposed on a side of a second housing 20 that is away from a first housing 10.

Specifically, a sixth groove 207 is disposed on a side of the second housing 20b of the housing 100b that is away from the first housing 10. The first breathable film 40 is installed in the sixth groove 207. The sixth groove 207 provides an installation space of the first breathable film 40, so as to avoid occupying the internal space of the device.

In the housing provided in this embodiment of this application, the first housing is disposed outside the second housing; a decoration part is disposed on the first housing; a second through-hole provided by the second housing, a first gap between the decoration part and the second housing, and a third through-hole provided by the decoration part form an airflow channel on the housing; and the first breathable film is disposed on the second through-hole, so that the housing has a pressure balancing performance.

The housing provides an airflow channel. When the housing is installed on a device, no internal space of the device is not occupied, and a pressure balancing structure does not need to be disposed inside the device.

An orthographic projection of the third through-hole on the second housing is located outside the second through-hole, so as to prevent a sharp object from piercing the first breathable film in the second through-hole through the third through-hole.

The foregoing implementations are only used to describe the technical solutions of this application, but not intended to constitute any limitation. Although this application is described in detail with reference to the foregoing example implementations, a person of ordinary skill in the art should understand that modifications or equivalent replacements can be made to the technical solutions of this application without departing from the spirit and scope of the technical solutions of this application. A person skilled in the art can also make various changes to design of this application without departing from the spirit of this application, provided that such changes do not deviate from the technical effects of this application. These changes made according to the spirit of this application shall be included in the scope disclosed in this application.

What is claimed is:
1. A housing, comprising:
a first housing with a first through-hole;
a second housing with a second through-hole;
a decoration part with a third through-hole; and
a first breathable film
wherein the first housing is disposed outside the second housing, and the decoration part is disposed on the first housing and covers the first through-hole;

wherein an orthographic projection of the third through-hole on the second housing is located outside an orthographic projection of the second through-hole on the second housing;

and a first gap exists between the decoration part and the second housing, and the first gap is communicated with both the second through-hole and the third through-hole; and wherein the first breathable film is disposed on the second housing and covers the second through-hole.

2. The housing according to claim 1, wherein a first groove is disposed on a side of the second housing that faces the first housing, and the first groove intersects the second through-hole; and wherein the decoration part is connected to the first housing on a peripheral side of the first through-hole in a sealed manner, and the first gap exists between the decoration part and a groove wall of the first groove.

3. The housing according to claim 2, wherein the housing further comprises a support member; wherein two sides of the support member are respectively in contact with the groove wall of the first groove and the decoration part; and wherein the support member is provided with a second groove, and the second groove forms the first gap.

4. The housing according to claim 2, wherein the first breathable film is attached to the groove wall of the first groove;

wherein the housing further comprises a pressing member abutting on the first breathable film; and wherein a third groove is disposed in the pressing member, and the third groove is communicated with both the first gap and the second through-hole.

5. The housing according to claim 4, wherein the pressing member is bonded to the first housing or the groove wall of the first groove.

6. The housing according to claim 4, wherein the decoration part comprises a main body and a connection portion; wherein the connection portion is disposed on a peripheral side of the main body; and wherein the main body is exposed from the first through-hole; and the connection portion is connected to the first housing in a sealed manner, and the main body is connected to the second housing.

7. The housing according to claim 4, wherein the decoration part comprises a main body and a connection portion; wherein the connection portion is disposed on a peripheral side of the main body; and wherein the main body is exposed from the first through-hole; and the connection portion is connected to the first housing in a sealed manner, and the connection portion is connected to the second housing.

8. The housing according to claim 7, wherein a second gap exists between a side wall of the connection portion and the pressing member, and the second gap is communicated with the first gap.

9. The housing according to claim 1, wherein the first breathable film is a film structure with waterproof performance, the first housing is a structure made of a soft material with waterproof performance, and a hardness of the decoration part is greater than that of the first housing.

10. The housing according to claim 1, wherein the housing further comprises a second breathable film, wherein the second breathable film is disposed on the decoration part and covers the third through-hole.

11. The housing according to claim 2 wherein a part of the groove wall of the first groove of the housing extends outward to form a support portion.

12. The housing according to claim 1, wherein an annular structure is disposed on a side of the decoration part that is away from the second housing, and wherein the first through-hole is exposed from the annular structure; and wherein the third through-hole is located in the annular structure.

13. The housing according to claim 1, wherein the number of the third through-holes is two.

14. A terminal device, comprising the housing according to claim 1, wherein the housing is configured to isolate an internal space from an external space of the terminal device, the third through-hole is communicated with the external space of the terminal device, and the first housing forms an outer surface of the terminal device.

15. The housing according to claim 14, wherein a first groove is disposed on a side of the second housing that faces the first housing, and the first groove intersects the second through-hole; and wherein the decoration part is connected to the first housing on a peripheral side of the first through-hole in a sealed manner, and the first gap exists between the decoration part and a groove wall of the first groove.

16. The housing according to claim 15, wherein the housing further comprises a support member; wherein two sides of the support member are respectively in contact with the groove wall of the first groove and the decoration part; and wherein the support member is provided with a second groove, and the second groove forms the first gap.

17. The housing according to claim 15, wherein the first breathable film is attached to the groove wall of the first groove;

wherein the housing further comprises a pressing member abutting on the first breathable film; and wherein a third groove is disposed in the pressing member, and the third groove is communicated with both the first gap and the second through-hole.

18. The housing according to claim 17, wherein the pressing member is bonded to the first housing or the groove wall of the first groove.

19. The housing according to claim 17, wherein the decoration part comprises a main body and a connection portion; wherein the connection portion is disposed on a peripheral side of the main body; and wherein the main body is exposed from the first through-hole; and the connection portion is connected to the first housing in a sealed manner, and the main body is connected to the second housing.

20. The housing according to claim 19, wherein a second gap exists between a side wall of the connection portion and the pressing member, and the second gap is communicated with the first gap.

* * * * *